United States Patent
Strip et al.

(10) Patent No.: US 7,169,232 B2
(45) Date of Patent: Jan. 30, 2007

(54) PRODUCING REPETITIVE COATINGS ON A FLEXIBLE SUBSTRATE

(75) Inventors: David R. Strip, Albuquerque, NM (US); Yuan-Sheng Tyan, Webster, NY (US); Ronald S. Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 224 days.

(21) Appl. No.: 10/858,424

(22) Filed: Jun. 1, 2004

(65) Prior Publication Data

US 2005/0274319 A1    Dec. 15, 2005

(51) Int. Cl.
C23C 14/12 (2006.01)

(52) U.S. Cl. .................... 118/718; 118/726; 427/248.1; 427/255.6

(58) Field of Classification Search ................ 118/219, 118/221, 233, 235, 255, 304, 320, 35–37, 118/683, 684, 718, 33, 726; 427/402, 420, 427/425, 426, 248.1, 255.6
See application file for complete search history.

(56) References Cited

U.S. PATENT DOCUMENTS

| | | | |
|---|---|---|---|
| 3,661,735 A | * | 5/1972 | Drelich ...................... 204/165 |
| 3,829,373 A | * | 8/1974 | Kuehnle ................. 204/298.24 |
| 3,884,787 A | | 5/1975 | Kuehnle et al. |
| 4,151,064 A | * | 4/1979 | Kuehnle ................. 204/298.28 |
| 5,097,800 A | * | 3/1992 | Shaw et al. .................. 118/730 |
| 5,296,036 A | * | 3/1994 | Matsuyama et al. ........ 118/718 |
| 6,579,422 B1 | | 6/2003 | Kakinuma |
| 6,717,358 B1 | | 4/2004 | Liao et al. |
| 2003/0124392 A1 | | 7/2003 | Bright |

FOREIGN PATENT DOCUMENTS

JP    1-156464    * 6/1989

* cited by examiner

*Primary Examiner*—Laura Edwards
(74) *Attorney, Agent, or Firm*—Raymond L. Owens

(57) ABSTRACT

Apparatus for use in making a device by forming repetitive sequences of coatings on a flexible substrate including defining a path for the flexible substrate; the flexible substrate being disposed about at least a portion of the path; a first deposition source for depositing material located around the path periphery and in cooperative relationship with the surface of the disposed flexible substrate; an actuable structure effective when actuated for moving the flexible substrate around at least more than one revolution around the path; and actuating the actuable structure and the first deposition source so that at least two separate material coatings are provided on the substrate by the deposition source.

14 Claims, 8 Drawing Sheets

PRODUCING REPETITIVE COATINGS ON A FLEXIBLE SUBSTRATE

FIELD OF THE INVENTION

The present invention relates to producing repetitive sequences of coatings on a flexible substrate.

BACKGROUND OF THE INVENTION

The organic light emitting diode (OLED) is an example of a material that is produced by coating multiple layers of different materials on a substrate. The canonical OLED structure includes a cathode (C), a hole transport layer (HTL), an emissive layer (EL), an electron transport layer (ETL), and an anode (A). This structure is presented as C-HTL-EL-ETL-A. This canonical structure represents a simplification of the more complex structures that have evolved as OLED devices and manufacture have become more sophisticated. However, for the purposes of this invention, using this simplified description makes description and understanding of the invention easer. For more specific examples of device structure in which a subset of the device layers are repeated, see for example, in Liao et al., U.S. Pat. No. 6,717,358. In these recently disclosed devices, the somewhat simplified representation of the structure has the form C-(HTL-EL-ETL)$^n$-A, where the notation ( ... )$^n$ indicates that the group inside the parentheses can be repeated two or more times. This class of device structures, which are referred to as a stacked OLED, is important because it provides increased device efficiency at a relatively modest cost in device complexity.

A number of disclosures have proposed strategies for the making of OLED devices on flexible substrates by utilizing web-based coating systems, for example, in Kakinuma, U.S. Pat. No. 6,579,422. In a web-based system, a flexible substrate is moved past stationary deposition sources using a variety of ways that are common in web transport systems, such as rollers, drums, tensioning devices, etc. In previously disclosed systems it is necessary to provide a coating station containing the deposition sources for each layer of the OLED being produced. As a consequence, making of a device such as the stacked OLED requires an additional set of coating sources for each copy of the repeated group in the stack. This is a severe drawback for two reasons. First, it is expensive to replicate the sources, both in initial capital and on-going operational cost. Second, the resulting system can only be used with great difficulty and waste to make devices with a smaller number of replications in the stack.

SUMMARY OF THE INVENTION

It is an object of the present invention to provide a way of more effectively producing stacked OLED devices. In accordance with the present invention, it has been found that if a flexible substrate is used and can be wound around a drum so that one or more revolutions of the flexible substrate is wound around the drum, a more efficient deposition of materials is provided.

This object is achieved by apparatus for use in making a device by forming repetitive sequences of coatings on a flexible substrate, comprising:

a) means defining a path for the flexible substrate;

b) the flexible substrate being disposed about at least a portion of the path;

c) a first deposition station for depositing material located around the path periphery and in cooperative relationship with the surface of the disposed flexible substrate;

d) actuable means effective when actuated for moving the flexible substrate around at least more than one revolution around the path; and e) means for actuating the actuable means and the first deposition station so that at least two separate material coatings are provided on the substrate by the deposition station.

DETAILED DESCRIPTION OF THE INVENTION

A number of systems have been proposed for the web production of OLEDs. These systems are quite similar to those used for coating webs for other purposes, such as metallizing plastic films for food containers such as potato chip bags.

Figure 1A:
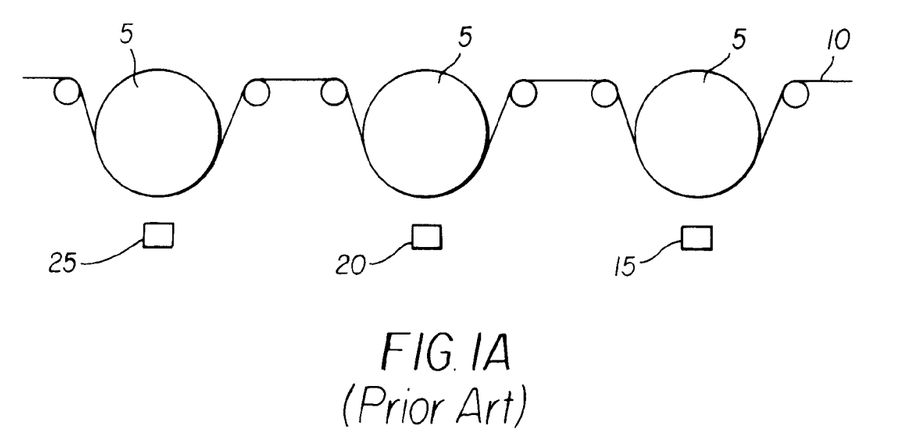
FIG. 1A and FIG. 1B show prior art arrangements for coating multiple layers on a flexible substrate.
Figure 1B:
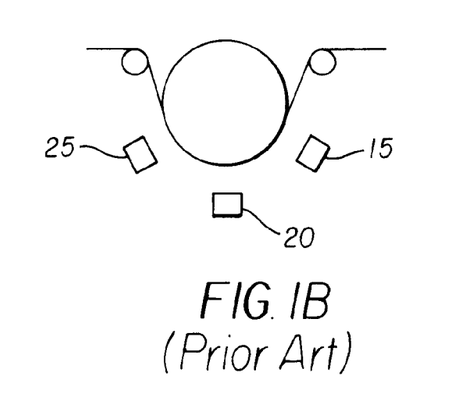

Referring to FIG. 1A, prior art systems typically include a coating drum 5 around which a flexible substrate 10 is wrapped. A source 15 is located at a distance from the surface of the drum, where the distance is determined by the nature of the deposition process and operating characteristics of the source. As shown in U.S. Pat. No. 6,579,422, for each additional source 20 and 25, an additional coating drum is added to the system. For the three-layer sequence (HTL-EL-ETL), three coating drums are required for each additional grouping on the stacked device. FIG. 1B depicts a prior art arrangement having multiple sources 15, 20, and 25 around a single coating drum. This introduces challenges in balancing deposition rates and guarding against contamination, but these can be addressed, resulting in a system with a smaller footprint. Even with this more efficient approach, an additional coating drum and set of sources is required for each group of layers in the stack.

Figure 2:
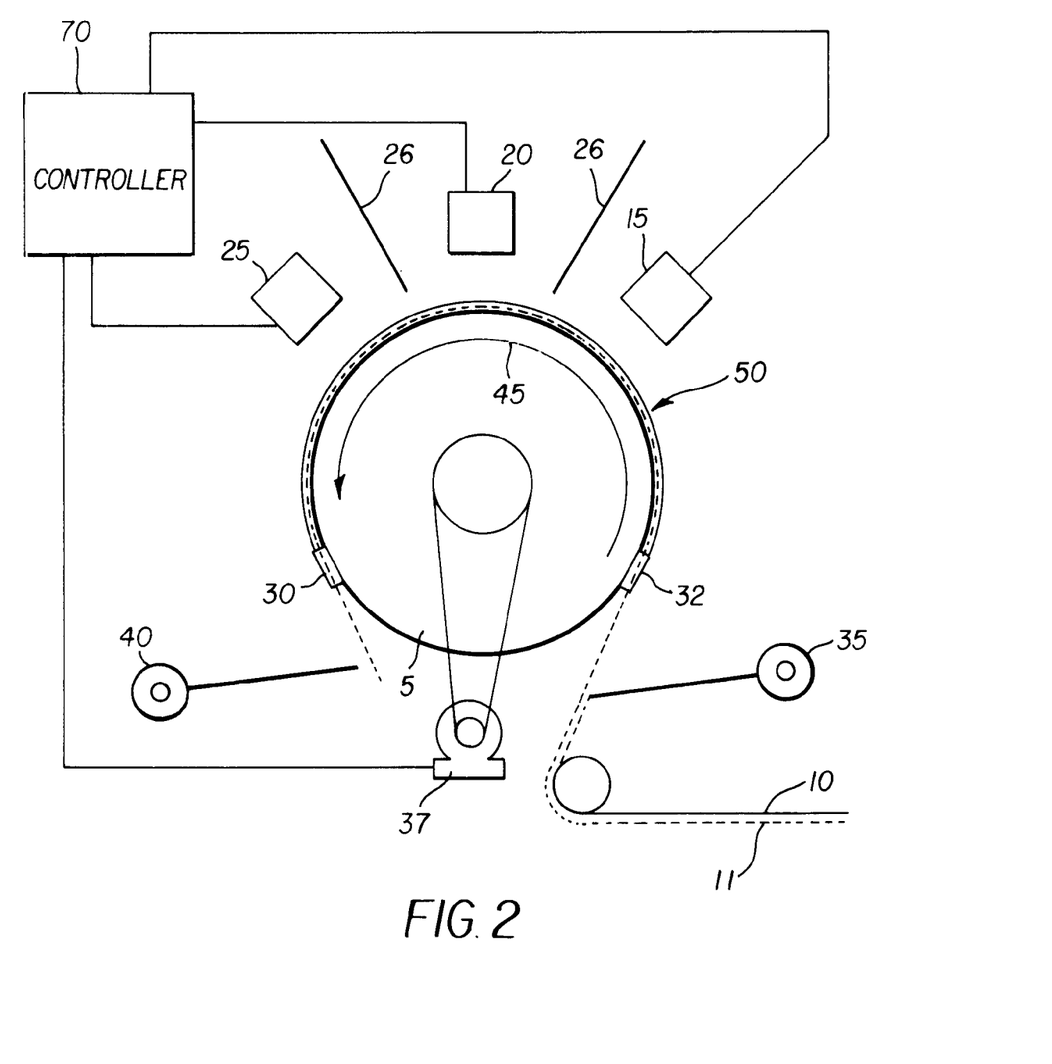
FIG. 2 is an illustration of an embodiment of the invention suited for use with sheet-fed flexible substrates.

FIG. 2 illustrates an embodiment of the invention particularly suited to use in a sheet-fed coater for flexible substrates, though it could be used in a continuous web system as well. In this embodiment, a flexible substrate 10 is supplied in cut-sheet form. The invention contains a path 11 around part of which the substrate is wrapped. The substrate is grasped by the on-loader 35 and the leading edge of substrate is secured to drum 5 with a leading clamp 30. Among acceptable clamping means are mechanical clamps or, if conditions permit, can be a vacuum clamp, or other clamping mechanisms. The drum 5 is rotated in direction 45 until the trailing clamp 32 can be affixed. The drum 5 is driven by an actuable motor 37, the affixed substrate 50 is moved past a first deposition source 15. A controller 70 controls the time of actuating, the duration of actuation, and rate of motion for the actuating means. In addition, controller 38 controls the operations of source by ways such as metering input material, controlling temperature, or other ways well known to those of ordinary skill in the art. A second deposition source 20, and even a third deposition source 25, can be arrayed around the drum 5. The surface of the drum 5 defines the path that the substrate takes around the deposition sources. As the substrate moves along the path past each source, a layer of material is deposited under the source under the control of the controller. The repetitive sequence of coating of materials on the substrate takes place after the substrate passes under each source. The repetitive sequence of coatings is called the stack. The drum is rotated for more than one full revolution. If the drum is rotated for two revolutions, each portion of the substrate is exposed twice in sequence to the sources, producing two stacks. By continuing to rotate the drum with the affixed substrate it is possible to build up any desirable number of stacks. Baffles 26 are optionally provided to prevent cross-contamination by adjacent sources. It is clear to one of ordinary skill that the number of sources shown here is purely exemplary. The actual number of sources is a matter of design selection. After the drum has rotated the appropriate number of times to produce the desired number of layers, the affixed substrate 50 is rotated to a position which permits the leading edge clamp to be released. The leading edge of the substrate is grasped by the off-loader 40 and pulled from the drum 5 as the drum rotates to a position which permits the trailing edge to be unclamped and then the sheet is fed to the next source in the system.

In the making of a conventional OLED device, one deposition source would deposit a hole transport material, a second deposition source would deposit an emitter material, and a third deposition source would deposit an electron transport material.

While the embodiment of FIG. 2 is illustrated for deposition over the entire surface of the substrate 10, it is also possible to provide a patterned deposition. A patterned deposition can be accomplished by at least two methods. In a first method, the sources are turned on and off at predetermined moments with respect to the rotation of the substrates 10. Such intermittent deposition can provide a way to deposit material across the width of the substrate (or source width) orthogonal to the direction of rotation with periodic interruptions in coatings in the direction of substrate movement. Such patterns are useful for ensuring that material is deposited on the substrate only or for providing stripes of material across the width of the substrate 10.

Figure 3:
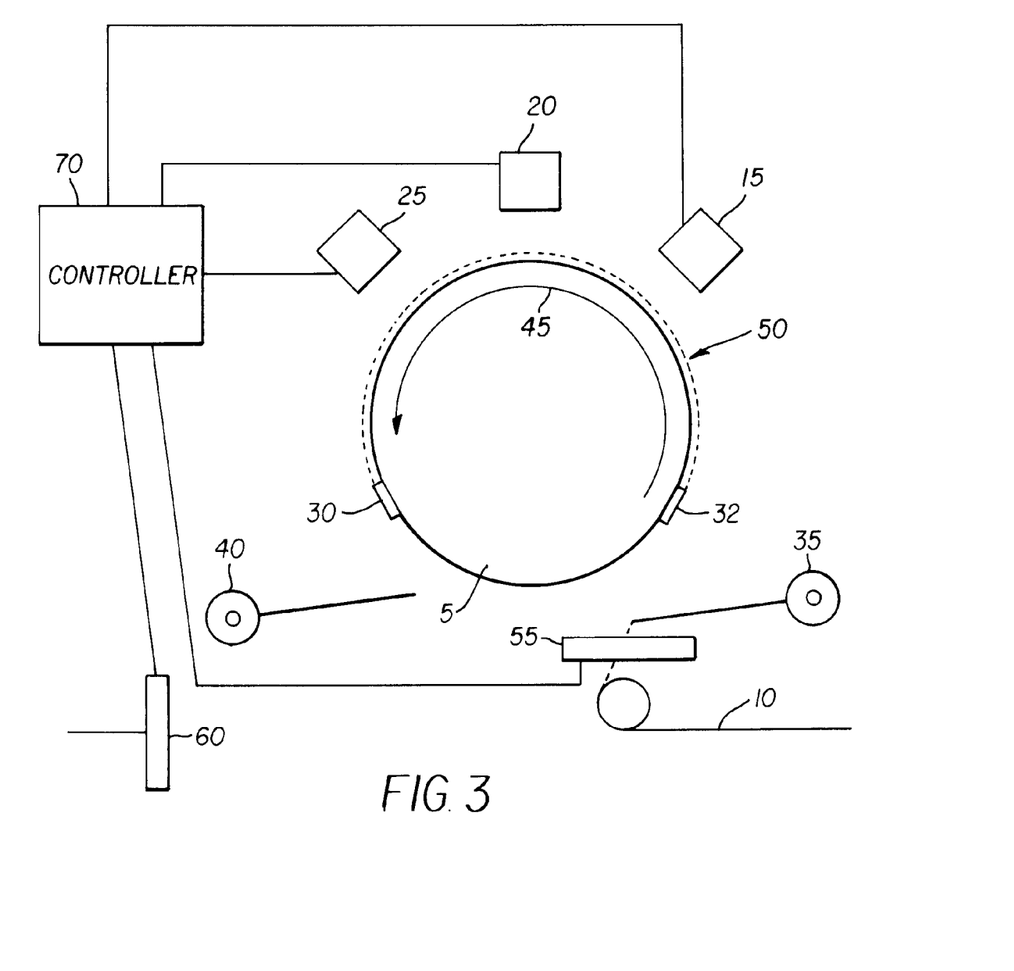
FIG. 3 is an illustration of an embodiment of the invention suited for used with roll-fed substrates.

FIG. 3 illustrates an embodiment of the system which is suited for use with continuous rolls of flexible substrate. In this embodiment, the substrate 10 is supplied in long rolls. Where parts correspond to the same structures used in FIG. 2, the same reference numbers will be used. The substrate is cut at cutter station 55, which permits it to be affixed to the coating drum 5 in the same manner as the cut sheets in the previous embodiment. After the substrate has been coated with the desired number of stacks, it is off-loaded through a splicing unit 60 which returns the material to its original continuous nature. The cutter station and splicing unit can be controlled by a controller 70.

Figure 4:
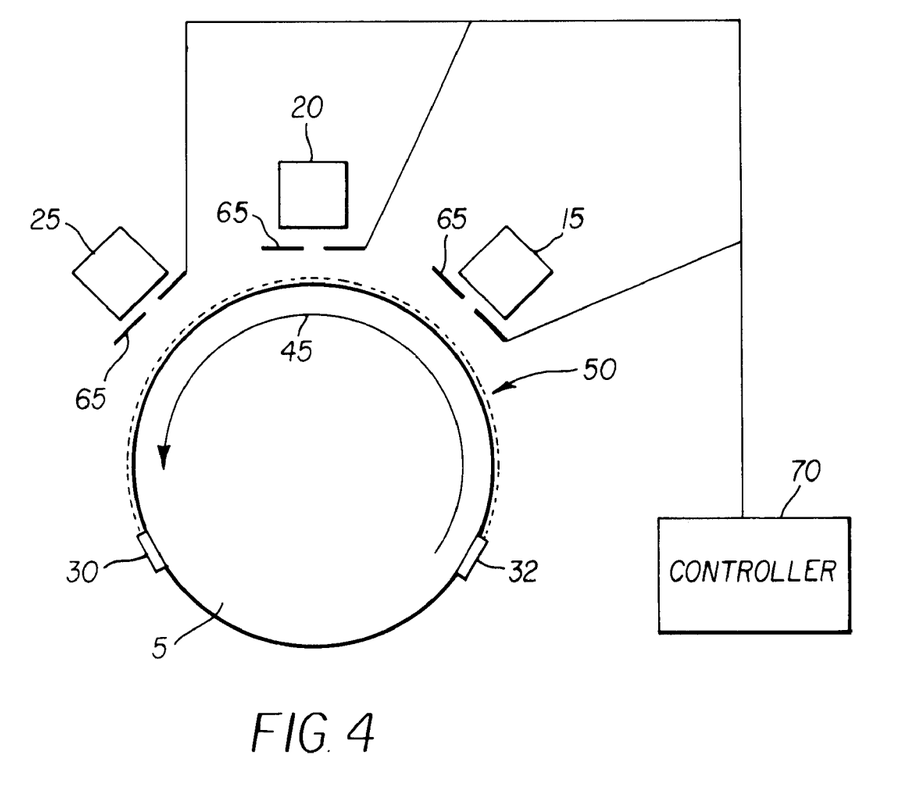
FIG. 4 is a perspective of an embodiment of the invention providing control over the sources.

FIG. 4 shows an alternative embodiment in which the embodiment of FIG. 2 is supplemented with shutters 65 interposed between each source 15, 20, and 20, and the substrate affixed to the drum 5. Where parts correspond to the same structures used in FIG. 4, the same reference numbers will be used. Each shutter is connected to a controller 70. By opening, closing, or partially closing the shutters by command of the controller, controlled differences can be introduced in each replica of the same stack. It should be clear to one of ordinary skill that shutters are but one of many ways available to control deposition rate from a source, and that the differences in stack replicas are a consequence in this change of deposition rate. Other methods for controlling deposition rate, such as changing material supply rates, and source temperature, can be used in accordance with the present invention. It will also be clear to one of ordinary skill in the art that the use of shutters can be employed together with patterned masks to provide additional flexibility in the deposition of material onto substrates.

Figure 5:
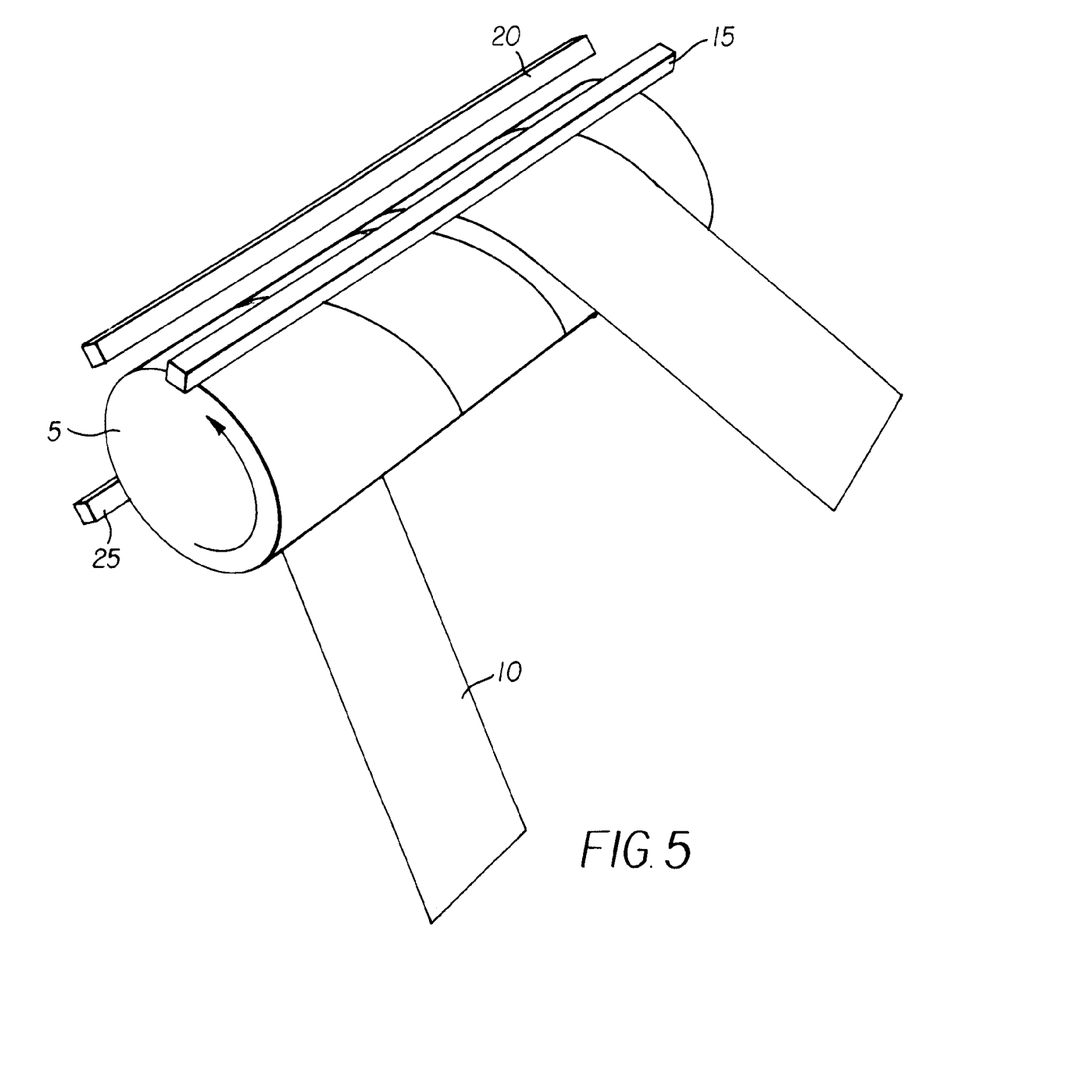
FIG. 5 is a perspective of an embodiment which permits continuous processing of roll-fed substrates.

The embodiment shown in FIG. 5 is particularly suited to the processing of roll-fed substrates where the number of stacks is small. The substrate 10 is wrapped at a skew angle of less than 90 degrees around the drum 5 multiple times around the drum like a stripe on a barber pole before exiting the drum. The skew angle of the path is selected so that no portion of the substrate overlaps any other portion of the substrate. As the drum rotates, the substrate moves past one or more sources 15, 20, and 25 (previously described) which are of sufficient extent to be able to deposit over material over the width of the drum covered by the substrate. Thus, if the substrate is wrapped twice around the drum, it will contain two stacks of deposited material by the time it exits the drum. In general, the substrate will contain as many layers as there are wraps. Although no shutters or controller are shown, it is clear to one of ordinary skill in the art that equivalent control mechanisms exist for this configuration, particularly deposition rate control mechanisms that permit differences along the length of the source, permitting each region corresponding to the location of a single wrap of the substrate on the drum to be independently controlled.

Figure 6A:
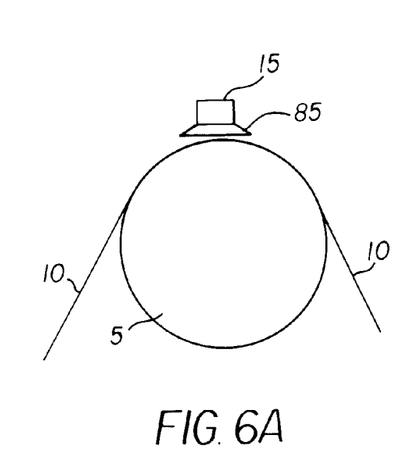
FIGS. 6A–D depict different belt mask arrangements for patterning the substrate.

In an alternative method, a patterned deposition can be accomplished by providing a mechanical mask interposed between the substrate 10 and deposition sources 15, 20, and 25. The masking can be provided by a variety of ways. As shown in FIG. 6A, a stationary mask 85, i.e. a mask that does not travel with the substrate 10, can be provided and affixed to a deposition sources. Such a stationary mask will enable the deposition of linear patterns which can be useful, for example, with OLED display devices employing a stripe pixel configuration. By combining the intermittent deposition with a stationary mask, a two-dimensional deposition pattern can be produced.

Figure 6B:
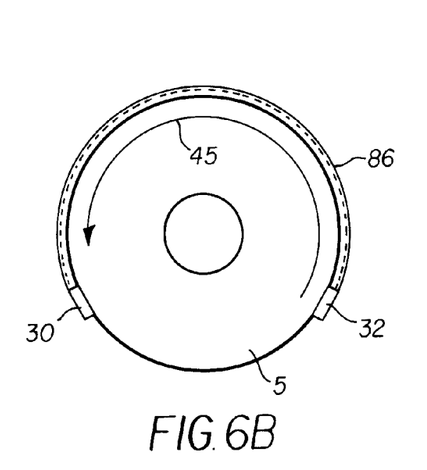

Masks that travel with the substrate can also be employed. FIG. 6B shows a clamped mask 86 clamped with the substrate 10 to the drum 5. Using such a mask will permit every source 15, 20, or 25 to deposit material through a common mask to form a common pattern. Such an arrangement can be very useful for example, to define deposition areas within a larger substrate, for example to build two separate OLED devices on a common substrate.

Figures 6C, 6D:
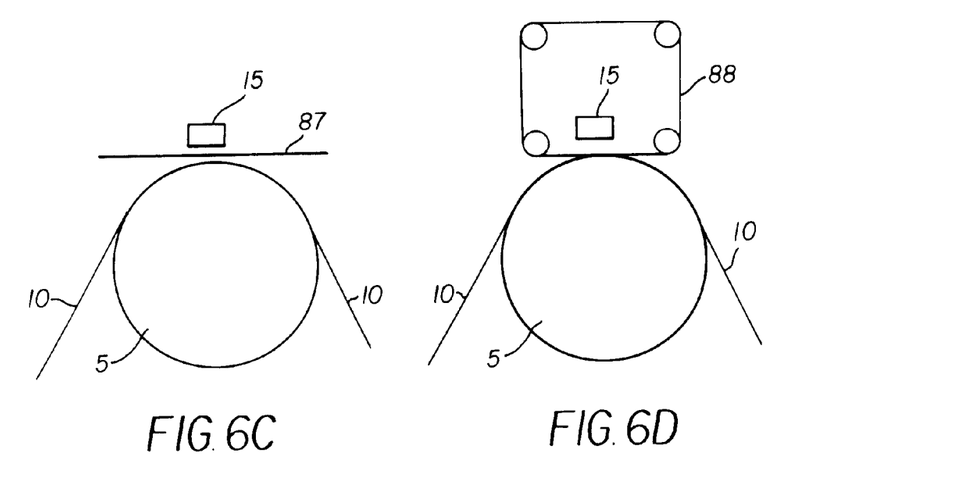

FIG. 6C shows an alternative arrangement for providing a mask that moves with the substrate can be employed by a separate mechanism for moving a sheet mask 87 past the sources 15, 20, or 25 in close proximity to the substrates. Such moving masks can be sheets or a continuous mask. If a sheet-fed mask is employed, a single sheet is moved past a source in close registration and at the same velocity as a substrate 10. Each source 15, 20, or 25 can employ a separate mask so as to provide a different pattern for each source. Alternatively, a mask can travel from source to source. In such a design, ways to store, singulate, and move masks must be provided and are described, for example, in commonly assigned U.S. patent application Ser. No. 10/712, 176 filed Nov. 13, 2003 by Ronald S. Cok et al., entitled "Continuous Manufacture of Flat Panel Light Emitting Devices", the disclosure of which is herein incorporated by reference.

FIG. 6D shows alternatively that a continuous mask 88 can be employed to provide patterning to a substrate. In this approach, a continuous belt of material, for example a thin metal, can have patterned openings provided in the material to form a patterned mask. This continuous mask moves at the same speed as the substrate 10 past a source to provide a patterned deposition. A separate, continuous mask can be employed for each source, or alternatively, a single continuous mask be employed for a plurality of sources. Referring to FIG. 6D, a continuous mask 88 is provided and moved around rollers 80 in concert with substrate 10 on drum 5.

FIGS. 6A, 6C, and 6D are end views of drum systems in which the substrate is wrapped multiple times around a drum at a skew angle as shown in FIG. 5, while FIG. 6B utilizes a cut-sheet and drum system as originally shown in FIG. 1. Each of these masking embodiments can be employed with any of the path and actuation mechanisms presented here.

Any one or group of sources 15, 20, or 25 can be employed with a patterned mask. Other sources cannot employ a source and any combination of patterned sources and unpatterned sources can be employed to provide a great variety of deposition layers, both patterned and unpatterned.

Figure 7:
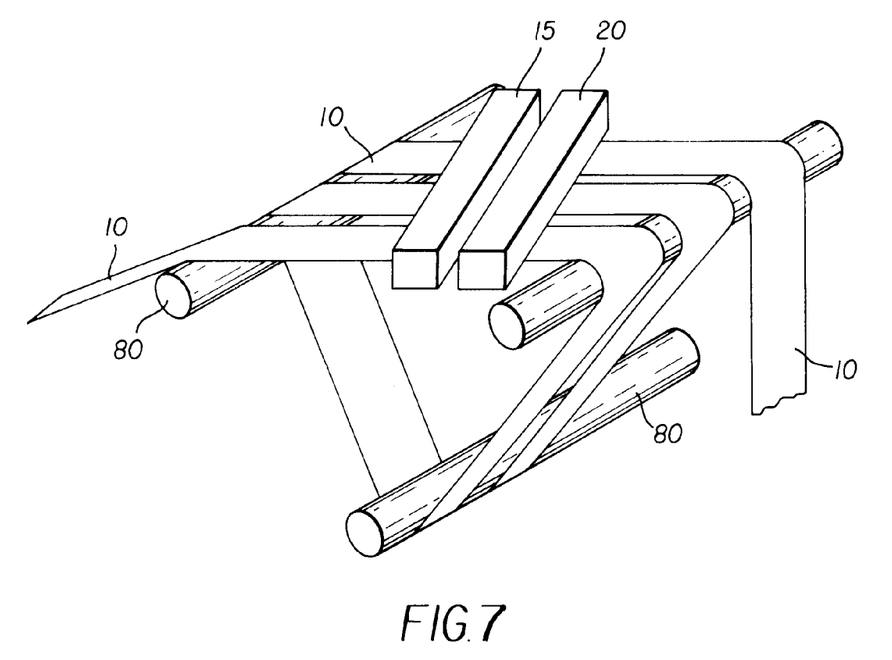
FIG. 7 is a perspective of an alternative embodiment suited to high-speed processing of roll-fed substrates.

If the sources are stopped and started, as described in FIG. 5 above, the area of deposition will be shaped in a rhombus. To provide a rectangular deposition area when the sources are stopped and started, the drum 5 can be replaced by a polygonal transport system having flat faces and drums or rollers at the vertices. Referring to FIG. 7, the substrate 10 is passed at an angle across rollers 80 to provide faces with sources 15 and 20 oriented at a similar angle. Drums 5 can also provide the transport mechanism as described above in place rollers 80 together with sources 15 and 20.

Figure 8:
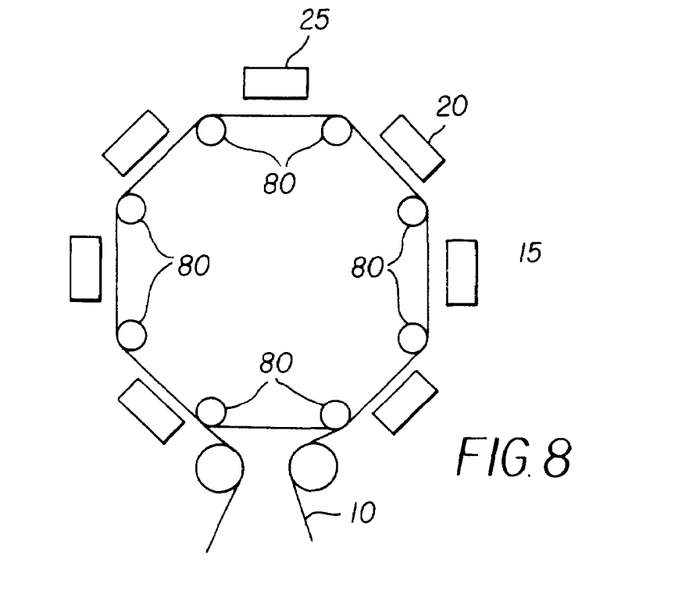
FIG. 8 is an end view of another embodiment of the present invention using a series of rollers to define the substrate path.

FIG. 8 shows an end view of another embodiment depicting a polygonal path with a large number of sides. Multiple rollers 80 are disposed, each at a vertex of the polygon. In an alternative embodiment of the present invention, the drum 5 can be polygonal together with a variety of sources oriented across the faces of the polygon.

Figure 9:
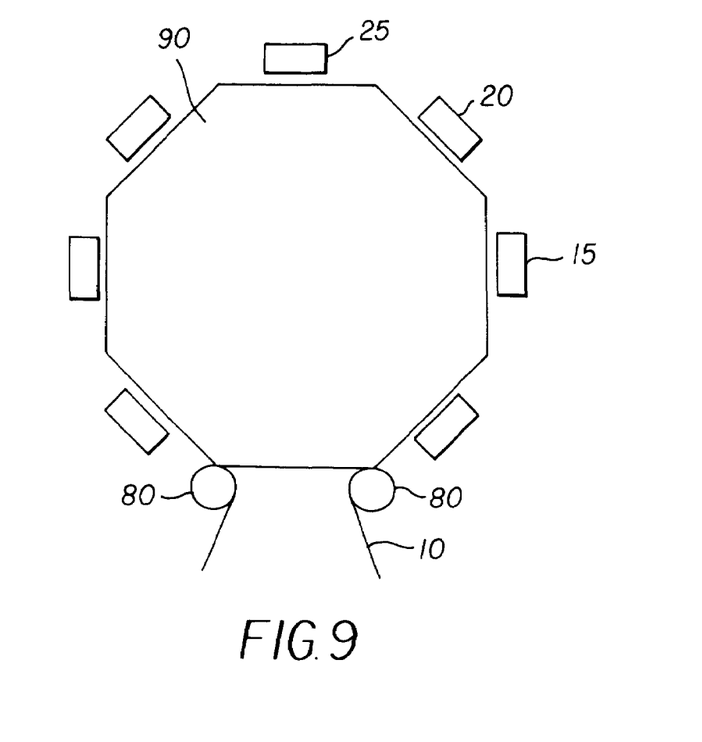
FIG. 9 is an end view of another embodiment of the present invention using a polygonal drum.

Referring to FIG. 9, a stationary polygonal drum 90 defines the path and sources 15, 20, and 25 are located adjacent to different faces of the path. These sources deposit material onto the substrate 10 controlled by rollers 80. The substrate can be wrapped around the drum multiple times at an angle to the axis of the polygonal drum as illustrated in FIG. 8, and sources 15, 20, and 25 can deposit material across multiple widths of substrate as shown in FIG. 5. The corners of the polygons can be rounded or provided with rollers to provide a smooth surface across which the substrates can be curved.

Although the invention has been described in terms of sources and deposition, it should be clear to one skilled in the art that any process capable of localized effect can be utilized in this invention. For example, what is referred to as a source could be a liquid curtain coater as is common in coating aqueous films on a substrate. Equally, the source could be an electron beam source used for surface treatment, a corona system for inducing a static charge, a heating system to dry a previously coated material, a UV exposure system for curing a previously coated material, or a variety of other coating or treating devices. In the case of our motivating OLED example, the source would be a low pressure sublimation heater for ballistic deposition of organic materials, with the entire system operating in a low pressure environment.

Various combinations of the described drum arrangements and patterning mechanisms lend themselves to differing degrees of control in producing varying patterns on the processed substrates. For example, the multi-revolution drum systems of FIGS. 2 and 3 combined with a single-sheet mask, lend themselves to uses that require common patterns for all the layers within a stack, but different patterns for each layer. The same drum system, combined with the continuous mask 85 of FIG. 6C, is well suited to producing a unique pattern for each source that remains constant for each layer. All of the systems presented can be readily adapted to produce unpatterned substrate intermixed with patterned substrates.

Web-based production systems are known to have susceptibilities to problems with registration due to stretch, shrink, slipping, and thermal expansion, among others. The drum-based approach described in this invention ameliorates or limits many of these problems. Because the substrate has a very large wrap angle on the drum, it is maintained in a much more stable configuration, preventing the sorts of movement that lead to a variety of registration problems.

The invention has been described in detail with particular reference to certain preferred embodiments thereof, but it will be understood that variations and modifications can be effected within the spirit and scope of the invention.

PARTS LIST 5 coating drum
10 flexible substrate
11 path
15 source 1
20 source 2
25 source 3
26 baffle
30 leading clamp
32 trailing clamp
35 on-loader
37 motor
40 off-loader
45 direction of rotation
50 affixed substrate
55 cutter station
60 splicer
65 shutter
70 controller
80 roller
85 mask
86 clamped mask
87 sheet mask
88 continuous mask
90 polygonal drum

The invention claimed is:

1. Apparatus for use in making an OLED device by forming repetitive sequences of organic coatings on a flexible substrate, comprising:
   a) means defining a path for the flexible substrate;
   b) the flexible substrate being disposed about at least a portion of the path;
   c) first and second low pressure sublimation deposition sources for depositing different organic materials located in spaced apart positions around the path periphery and in cooperative relationship with the surface of the disposed flexible substrate;

d) actuable means effective when actuated for moving the flexible substrate around at least more than one revolution around the path; and e) means for actuating the actuable means and the first and second low pressure sublimation deposition sources so that at least two separate organic material coatings are provided on the substrate by the low pressure sublimation deposition sources.

2. The apparatus of claim 1 wherein the means of element e) causes the second low pressure sublimation deposition source to form a second organic coating over the first organic coating formed by the first low pressure sublimation deposition source and then causes the first low pressure sublimation deposition source to form a third coating over the second organic coating.

3. The apparatus of claim 1 further including means for cutting the flexible substrate into discrete sheets before or after the sequence of coatings is provided.

4. The apparatus of claim 1 wherein the first low pressure sublimation deposition source deposits a hole transport material, and the second low pressure sublimation deposition source deposits a light emitting material.

5. The apparatus of claim 4 further including a third low pressure sublimation deposition source for depositing an electron transport material.

6. The apparatus of claim 1 wherein the first low pressure sublimation deposition source includes a mask that causes selective deposition of material.

7. The apparatus of claim 1 further including a mask disposed on the substrate that causes selective deposition of organic material from the first low pressure sublimation deposition source.

8. The apparatus of claim 1 wherein the path is defined by the surface of a rotating drum.

9. The apparatus of claim 8 wherein the flexible substrate is disposed around the drum at a skewed angle without overlapping any other portion of the substrate.

10. The apparatus of claim 1 further including at least one treatment device disposed in operative relationship with the disposed flexible substrate to treat the flexible substrate or a material deposited thereon.

11. The apparatus of claim 10 wherein treatment is provided by one or more of the following: corona treatment, curing, drying, or UV exposing treatments.

12. The apparatus of claim 1 wherein the path is polygonal.

13. The apparatus of claim 1 wherein the path is a spiral.

14. The apparatus of claim 12 wherein the polygonal path is defined by one or more rollers.

* * * * *